United States Patent
Lu

(10) Patent No.: US 10,189,976 B2
(45) Date of Patent: Jan. 29, 2019

(54) CURABLE COMPOSITION COMPRISING AN ETHYLENE POLYMER, A MONOPEROXYCARBONATE AND A T-ALKYL HYDROPEROXIDE

(71) Applicant: ARKEMA FRANCE, Colombes (FR)

(72) Inventor: Chao Lu, Jiangsu (CN)

(73) Assignee: ARKEMA FRANCE, Colombes (FR)

( * ) Notice: Subject to any disclaimer, the term of this patent is extended or adjusted under 35 U.S.C. 154(b) by 0 days.

(21) Appl. No.: 15/560,834

(22) PCT Filed: Feb. 24, 2016

(86) PCT No.: PCT/IB2016/000317
§ 371 (c)(1),
(2) Date: Sep. 22, 2017

(87) PCT Pub. No.: WO2016/151385
PCT Pub. Date: Sep. 29, 2016

(65) Prior Publication Data
US 2018/0112061 A1    Apr. 26, 2018

(30) Foreign Application Priority Data
Mar. 23, 2015   (WO) ................ PCT/CN2015/074871

(51) Int. Cl.
*C08K 5/14* (2006.01)
*H01L 31/048* (2014.01)

(52) U.S. Cl.
CPC ............ *C08K 5/14* (2013.01); *H01L 31/0481* (2013.01); *C08K 2201/014* (2013.01); *Y02E 10/50* (2013.01)

(58) Field of Classification Search
CPC ....... C07C 409/02; C07C 409/20; C08F 8/06; C08F 10/02; C08F 2810/20
See application file for complete search history.

(56) References Cited

U.S. PATENT DOCUMENTS

| | | | | |
|---|---|---|---|---|
| 3,939,133 A | * | 2/1976 | Roodvoets | C08K 5/14 525/332.5 |
| 4,015,058 A | * | 3/1977 | Schober | C08K 5/14 525/330.3 |
| 4,025,706 A | * | 5/1977 | Schober | C08K 5/14 427/117 |
| 4,873,274 A | * | 10/1989 | Cummings | C08F 299/0442 523/500 |
| 2008/0176994 A1 | * | 7/2008 | Allermann | C08K 5/14 524/563 |
| 2011/0152446 A1 | * | 6/2011 | Keromnes | C08J 3/24 524/557 |
| 2013/0087198 A1 | | 4/2013 | Naumovitz et al. | |

FOREIGN PATENT DOCUMENTS

| | | |
|---|---|---|
| EP | 2 242 647 b1 | 11/2011 |
| GB | 1 535 040 A | 12/1978 |
| JP | 2011-140588 A | 7/2011 |
| WO | WO 2010/007315 A2 | 1/2010 |

OTHER PUBLICATIONS

Yang, J. Cent. South Univ. Technol. (2007)05-0660-06 (p. 660-665). (Year: 2007).*
Stinson, J. Org. Chem. (1959) vol. 24, p. 1084-1088. (Year: 1959).*
2,5-dimethyl-2,5-dihydroperoxide Scifinder Data sheet (2018) (Year: 2018).*
International Search Report (PCT/ISA/210) dated Jun. 27, 2016, by the European Patent Office as the International Searching Authority for International Application No. PCT/IB2016/000317.
Written Opinion (PCT/ISA/237) dated Jun. 27, 2016, by the European Patent Office as the International Searching Authority for International Application No. PCT/IB2016/000317.
Thaworn et al., Effects of Organic Peroxides on the Curing Behavior of EVA Encapsulant Resin, *Open Journal of Polymer Chemistry*, May 2012, pp. 77-85, vol. 2, Scientific Research. http://dx.doi.org/10.4236/ojpchem.2012.22010.

* cited by examiner

*Primary Examiner* — Robert C Boyle
(74) *Attorney, Agent, or Firm* — Buchanan Ingersoll & Rooney P.C.

(57) ABSTRACT

The present invention pertains to a curable composition comprising (a) at least one ethylene polymer, (b) at least one monoperoxycarbonate, and (c) from 0.05 to less than 0.4 part by weight of at least one t-alkyl hydroperoxide for 100 parts by weight of constituent (b). It is also directed to a method for preventing scorching of a curable composition comprising an ethylene polymer by adding a specific amount of t-alkyl hydroperoxide thereto.

7 Claims, No Drawings

CURABLE COMPOSITION COMPRISING AN ETHYLENE POLYMER, A MONOPEROXYCARBONATE AND A T-ALKYL HYDROPEROXIDE

The present invention pertains to a curable composition comprising an ethylene polymer, such as an ethylene/vinyl acetate copolymer. It is also directed to a method for preventing scorching of a curable composition comprising such an ethylene polymer.

BACKGROUND OF THE INVENTION

Ethylene/vinyl acetate (EVA) is a copolymer widely used, inter alia, in solar panels, as an encapsulating material to protect solar cells (and especially the semiconductors contained therein) from outdoor environmental elements, especially moisture and UV radiation, and to provide electrical insulation. EVA indeed provides a good transparency and adhesion to the substrates of the photovoltaic (PV) module, together with a high resistivity and good moisture-barrier effect. These properties may alternatively be used in the manufacture of laminated glass.

It is common practice to crosslink these EVA copolymers in order to improve their thermal stability, especially their creep strength, their adhesion to the substrates and their weathering degradation resistance. For this purpose, various crosslinking agents have been used to date in the EVA formulation, which are typically peroxides such as dicumyl peroxide (DCP), peroxyesters, peroxyketals, peroxycarbonates and mixtures thereof. An example of monoperoxycarbonate used for this purpose is OO-t-butyl-O-2-ethylhexyl-monoperoxycarbonate (TBEC). This peroxide has proven to require a lower operating temperature than DCP, without providing the resulting product with a yellowish colour. It is thus used in the manufacture of photovoltaic modules (see for instance K. Thaworn et al., Open Journal of Polymer Chemistry, 2012, 2, 77-85). The Applicant has further shown that the addition of OO-t-amyl-O-2-ethylhexyl-monoperoxycarbonate (TAEC) to TBEC shortened the reaction time and improved the crosslinking density of EVA, which resulted in an increased tensile strength and a high modulus of the products made from the crosslinked EVA (WO 2010/007315).

During the laminating process of the PV module, the EVA composition is first deposited onto the frontsheet, then covered by the solar cells and deposited again thereon, before applying the backsheet, so as to obtain a PV module which is then heated at a certain high temperature for some time and pressed into place, whereby the EVA composition is cured.

It has been found that the EVA composition was susceptible to premature crosslinking in the barrel or die head of the extruder in which it is processed, prior to the formation of the above laminate. This phenomenon, which is called "scorching", results in irregularities in the EVA sheet thus formed, which in turn impairs the appearance and properties of the PV module. In some cases, pressure may also build up in the extruder, which requires discontinuing the extrusion process. This has especially been observed in the case of EVA having a relatively low melt-flow index and/or a relatively narrow molecular weight distribution (source: U.S. Pat. No. 4,015,058). However, on the other hand, in order to achieve commercially feasible process speeds, it is necessary that once the EVA sheets have been shaped and then heated above the thermal decomposition temperature of the peroxides, crosslinking proceeds as rapidly as possible in order to increase the economics of the process and also minimize possible side reactions.

Various solutions have been proposed to date to prevent scorching of EVA compositions. For instance, it has been suggested to add polymerization inhibitors to the EVA composition. However, unwanted yellowing has been noted. Alternatively, it has been proposed in U.S. Pat. No. 4,015,058 to add at least 1 wt. % of cumene hydroperoxide and/or tertiary butyl hydroperoxide to dicumyl peroxide (DCP). However, the crosslinking rate obtained with this system is not high enough for industrial applications, in particular in the manufacture of PV modules, due to the presence of DCP. Because of the aromatic structure of DCP, the yellowing problems also still remain.

Another solution has been provided in JP2011-140588, which is said to be appropriate for the manufacture of PV modules. It consists in adding from 4 to 50 parts by weight of a hydroperoxide, such as t-butyl hydroperoxide, to 100 parts by weight of an organic peroxide selected from a monoperoxycarbonate, a dialkyl peroxide, a peroxyketal and a peroxyester. Although this solution allows overcoming the drawbacks associated with the use of DCP, it has been found in JP2011-140588 that the above amounts of hydroperoxide negatively affected EVA crosslinking density. In this respect, it was suggested in this document to increase the total amount of monoperoxycarbonate and hydroperoxide while keeping the ratio of hydroperoxide to monoperoxycarbonate constant, i.e. around 20% (see Table 1).

SUMMARY

Surprisingly, the present inventors have found that the crosslinking density of EVA can be improved by lowering the weight ratio of hydroperoxide to monoperoxycarbonate to less than 0.4%. Moreover, they found a marked increase in the scorch preventing effect of the hydroperoxide at these low weight ratios, contrary to what was expected in JP2011-140588, without impairing the rate of the crosslinking reaction. Further, it was observed that the film homogeneity was satisfactory with substantially no bubbles. In this respect, it should be noted that bubbles formed by the evaporation of water entrapped within the film at extrusion temperatures above 100° C. are responsible for surface defects which negatively affect the resistivity of the film. This is particularly damaging in the case where the film is to be used as an encapsulating material in PV modules.

The compositions comprising an ethylene polymer such as EVA and the above peroxides may thus be processed in extruding devices at fast throughput rates without experiencing scorching.

It should be noted that monoperoxycarbonates are also useful for crosslinking other ethylene polymers such as polydiene elastomers, including ethylene-propylene-diene (EPDM) elastomers and also polyethylene, including low density and high-density polyethylene, which are used, inter alia, in the manufacture of wire and cable insulation, pipes and hoses (including pipes for automobile radiators, drinkable water and under-floor heating, for instance), roller coverings, rotational moldings and foamed articles. The composition of this invention is thus also useful in these applications, e.g. to prevent scorching while extruding the composition as an insulation sheath onto an electrical conductor.

More specifically, this invention is directed to a curable composition comprising:
 (a) at least one ethylene polymer,
 (b) at least one monoperoxycarbonate, (c) from 0.05 to less than 0.4 part by weight of at least one t-alkyl hydroperoxide for 100 parts by weight of constituent (b).

Some further features of the present invention are listed below:

advantageously, the ethylene copolymer is an ethylene/vinyl acetate copolymer.

preferably, the monoperoxycarbonate is selected from the group consisting of OO-t-alkyl-O-alkyl monoperoxycarbonates such as OO-t-butyl-O-2-ethylhexyl-monoperoxycarbonate (TBEC), OO-t-butyl-O-2-isopropyl-monoperoxycarbonate (TBIC), OO-t-amyl-O-2-ethylhexyl-monoperoxycarbonate (TAEC), OO-t-amyl-O-2-isopropyl-monoperoxycarbonate (TALC) and mixtures thereof, and more preferably TAEC and/or TBEC.

preferably, the composition according to the invention comprises from 0.1 to 0.2 part by weight of at least one t-alkyl hydroperoxide for 100 parts by weight of constituent (b).

It also pertains to the use of a t-alkyl hydroperoxide to prevent scorching of a curable composition comprising (a) at least one ethylene polymer, and (b) at least one monoperoxycarbonate, wherein the t-alkyl hydroperoxide represents from 0.05 to less than 0.4 part by weight for 100 parts by weight of constituent (b).

This invention is further directed to a method for preventing scorching of a curable composition comprising (a) at least one ethylene polymer, and (b) at least one monoperoxycarbonate, comprising the step of adding at least one t-alkyl hydroperoxide into the composition, in an amount of from 0.05 to less than 0.4 part by weight for 100 parts by weight of constituent (b).

It is also directed to a method for manufacturing a solar cell encapsulating material or sealant, comprising the step of extruding the above composition at a temperature between 80 and 150° C.

DETAILED DESCRIPTION

The ethylene polymer used as constituent (a) in this invention may be an ethylene homopolymer or preferably an ethylene copolymer. Examples of ethylene copolymers are those made from both ethylene monomers and at least one other monomer selected from hydrocarbons having at least one unsaturation such as propylene, butadiene, isoprene and styrene; acryl monomers such as acrylic acid, methacrylic acid, alkyl methacrylate and alkyl acrylate, wherein the alkyl group may be selected from methyl, ethyl, propyl or butyl, for instance; and vinyl monomers such as vinyl acetate. Usually, these copolymers comprise at 30 weight percent of ethylene and at most 70 weight percent of the other monomer(s).

According to a preferred embodiment, the ethylene copolymer is an ethylene/vinyl acetate (EVA) copolymer. The EVA copolymer may comprise from 15 to 60 wt. %, and preferably from 25 to 45 wt. %, of VA monomer. Examples of such EVA copolymers are available under the trade name "Evatane® 18-150" and "Evatane® 40-55" from ARKEMA.

Other ethylene polymers that may be used in this invention have been provided, e.g., in EP 2 242 647. They comprise a functionalized polyolefin, such as a homopolymer of ethylene or a copolymer of ethylene with an alkyl (meth)acrylate or vinyl acetate, which may be functionalized either by grafting of by copolymerization with maleic anhydride or glycidyl methacrylate. This functionalized polyolefin may optionally be mixed with a copolymer of ethylene/carboxylic acid vinyl ester such as EVA.

The ethylene polymer is mixed with a specific peroxide used as constituent (b), which is at least one monoperoxycarbonate. This peroxide compound may be selected from the group consisting of OO-t-alkyl-O-alkyl monoperoxycarbonates such as OO-t-butyl-O-2-ethylhexyl-monoperoxycarbonate (TBEC), OO-t-butyl-O-2-isopropyl-monoperoxycarbonate (TBIC), OO-t-amyl-O-2-ethylhexyl-monoperoxycarbonate (TAEC), OO-t-amyl-O-2-isopropyl-monoperoxycarbonate (TALC) and mixtures thereof. Preferred monoperoxycarbonates are TAEC and TBEC. According to an embodiment of this invention, a mixture of TBEC and TAEC is used as constituent (b), wherein TAEC represents from 0.001 to 99.9 wt %, relative to the total weight of the mixture. These monoperoxycarbonates are available under the trade name Luperox® or Lupersol® supplied by ARKEMA.

The amount of constituent (b) in the composition of this invention may range from 0.1 to 5 parts by weight, and preferably from 0.3 to 3 parts by weight, for 100 parts by weight of constituent (a).

The third component of the composition according to this invention is a t-alkyl hydroperoxide, which may be selected from the group consisting of t-butyl hydroperoxide (TBHP), t-amyl hydroperoxide (TAHP), t-hexyl hydroperoxide (THHP), 1,1,3,3-tetramethylbutyl hydroperoxide (TOHP), paramenthane hydroperoxide (PMHP), 2,5-dimethyl-2,5-dihydroperoxide (2,5-2,5) and their mixtures, for instance. Preferably, the t-alkyl hydroperoxide is TAHP.

The amount of constituent (c) in the composition of this invention ranges from 0.05 to less than 0.4 part by weight, and preferably from 0.1 to 0.2 part by weight, for 100 parts by weight of constituent (b).

The composition of this invention may further include additives such as coupling agents, UV stabilizers, UV absorbers, fillers, plasticizers, flame retardants, anti-oxidants, dyes and their mixtures. Examples of coupling agents are monoalkyl titanates, (vinyl)trichlorosilanes and (vinyl)trialkoxysilanes. They may represent from 0.01 to 5 wt. % relative to the weight of ethylene polymer. UV stabilizers may be chosen among hindered amine light stabilizers (HALS), whereas UV absorbers may be selected, for instance, from benzophenones, triazines and benzotriazoles. These compounds may represent from 0.01 to 3 wt. % relative to the weight of ethylene polymer. Inorganic fillers such as silicon dioxide, alumina, talc, calcium carbonate may be added to increase mechanical strength, although nanometric clays are preferred because of the transparency they provide. Examples of plasticizers are paraffinic or aromatic mineral oils, phthalates, azelates, adipates and the like. Antioxidants may be phenolic, phosphate or sulfur antioxidants. Alternatively, quinolines such as 1,2-dihydro-2,2,4-trimethylquinoline, may be used as an antioxidant.

According to a preferred embodiment, the composition of this invention does not include any aromatic peroxide such as dicumyl peroxide. Still preferably, this composition consists of constituents (a), (b) and (c) above and optionally at least one of the following additives: a coupling agent, a UV stabilizer, a UV absorber, a filler, a plasticizer, a flame retardant, an anti-oxidant, a dye and mixtures thereof.

The composition according to this invention may be prepared by mixing the above constituents (a) to (c) in conventional devices such as continuous mixers and compound extruders, below the degradation temperature of the peroxides.

It may then be used for the manufacture of various articles and more specifically in a method for manufacturing a solar cell encapsulating material or a solar panel sealant, comprising the step of extruding said composition at a temperature between 80 and 150° C., preferably from 90 to 120° C. The extrusion step may be performed in such a way as to obtain a sheet having a thickness of from 50 to 2000 μm, preferably from 100 to 1000 μm, for instance. It is thus possible to use a T-die extruder or alternatively a twin-screw extruder coupled with a two-roll mill. Preferably, a photovoltaic module will be built, comprising successively: a front sheet (such as a glass sheet or PMMA sheet), an encapsulating material sheet, solar cells (made from crystalline silicon or organic photovoltaics), another encapsulating material sheet, and a backsheet (such as a multilayer PVDF/PET film or a glass sheet or a PMMA sheet). This laminate may then be pressed by conventional techniques while heating and/or under vacuum, for instance at a temperature of from 130 to 180° C., more preferably from 140 to 155° C. under vacuum, for a curing time that may range from 1 to 20 minutes, for instance from 3 to 10 minutes. The encapsulating material sheet may be crosslinked during this pressing step of afterwards. Preferably, the process includes a single step of pressing and curing.

EXAMPLES

This invention will be better understood in light of the following examples which are given for illustrative purposes only and do not intend to limit the scope of the invention, which is defined by the attached claims.

Example 1

Scorch Protection Effect

Compositions according to this invention were prepared by mixing an ethylene/vinyl acetate (EVA) copolymer (Cosmothene® EVA KA-40 containing 28% VA, supplied by SUMITOMO) with OO-t-amyl-O-2-ethylhexyl-monoperoxycarbonate (Luperox® TAEC available from Arkema) and t-amyl hydroperoxide (Luperox® TAHP available from Arkema) in a Haake internal mixer at 35° C. for 12 minutes, using a stirring rate of 50 rpm/min. The polymeric mixture was then passed through an open mill set at 60° C. to produce sheets of about 2 mm thickness.

Samples of about 2 to 3 g of the above compositions were deposited in plate on a moving die rheometer (MDR) supplied by GOTECH, which is able to measure the cure properties of the samples and includes a DFT software for analyzing the results. Each of the samples is placed in a temperature-controlled cavity between two dies, the lower of which oscillates to apply a cyclic stress or strain to the sample while the upper die is connected to a torque sensor to measure the torque response of the sample at the deformation. The stiffness is recorded continuously as a function of time. The stiffness of the sample increases as vulcanization proceeds.

This apparatus is able to provide, inter alia, calculated values of ML (minimum torque), MH (maximum torque), tc10 (time to 10% state of cure) and tc90 (time to 90% state of cure) as defined by International Standards (ASTM D5289 and ISO 6502).

The MDR was operated at 105° C. with an oscillation amplitude (deformation degree) of 0.5° applied to the sample for 30 min. The scorch time was defined as the time necessary to reach 10% of the total cure, i.e. tc10.

This experiment was conducted on the following samples, wherein the amounts of TAEC and TAHP are indicated as parts per hundred parts of EVA resin (phr):

| | TAHP/TAEC (wt/wt) | MH-ML (dN-m) | tc10 (m:s) | tc90 (m:s) |
|---|---|---|---|---|
| 2 phr TAEC + 0.0004 phr TAHP | 0.02% | 1.19 | 08:02 | 27:14:00 |
| 2 phr TAEC + 0.002 phr TAHP | 0.09% | 1.17 | 08:16 | 27:26:00 |
| 2 phr TAEC + 0.0025 phr TAHP | 0.12% | 1.11 | 08:36 | 27:22:00 |
| 2 phr TAEC + 0.003 phr TAHP | 0.16% | 1.05 | 08:46 | 27:39:00 |
| 2 phr TAEC + 0.004 phr TAHP | 0.20% | 0.78 | 09:14 | 28:18:00 |
| 2 phr TAEC + 0.015 phr TAHP | 0.75% | 0.24 | 05:27 | 28:04:00 |
| 2 phr TAEC + 0.025 phr TAHP | 1.25% | 0.11 | 05:27 | 27:15:00 |

From this table, it can be seen that TAHP acts as a scorch-protection agent since scorch time (tc10) increases with the amount of TAHP. However, there is a dramatic decrease in scorch time, and thus a lower scorch protection effect of TAHP, when the latter reaches 0.75 wt % relative to TAEC. At lower values of TAHP, scorch is effectively prevented while maintaining a high crosslinking rate (tc90) and a good crosslinking density (MH-ML).

The invention claimed is:

1. A curable composition comprising:
  (a) at least one ethylene polymer,
  (b) at least one monoperoxycarbonate, and
  (c) from 0.05 to less than 0.4 part by weight of at least one t-alkyl hydroperoxide for 100 parts by weight of constituent (b).

2. The composition according to claim 1, wherein the ethylene copolymer is an ethylene/vinyl acetate copolymer.

3. The composition according to claim 1, wherein the monoperoxycarbonate is selected from the group consisting of OO-t-alkyl-O-alkyl monoperoxycarbonates such as OO-t-butyl-O-2-ethylhexyl-monoperoxycarbonate (TBEC), OO-t-butyl-O-2-isopropyl-monoperoxycarbonate (TBIC), OO-t-amyl-O-2-ethylhexyl-monoperoxycarbonate (TAEC), OO-t-amyl-O-2-isopropyl-monoperoxycarbonate (TAIC) and mixtures thereof.

4. The composition according to claim 1, wherein the t-alkyl hydroperoxide is selected from the group consisting of t-butyl hydroperoxide (TBHP), t-amyl hydroperoxide (TAHP), t-hexyl hydroperoxide (THHP), 1,1,3,3-tetramethylbutyl hydroperoxide (TOHP), paramenthane hydroperoxide (PMHP) and their mixtures.

5. The composition according to claim 1, wherein the composition comprises from 0.1 to 0.2 part by weight of at least one t-alkyl hydroperoxide for 100 parts by weight of constituent (b).

6. A method for preventing scorching of a curable composition comprising (a) at least one ethylene polymer, and (b) at least one monoperoxycarbonate, wherein the method comprises a step of adding at least one t-alkyl hydroperoxide into the composition, in an amount of from 0.05 to less than 0.4 part by weight for 100 parts by weight of constituent (b).

7. A method for manufacturing a solar cell encapsulating material or sealant, comprising a step of extruding a composition according to claim 1 at a temperature between 80 and 150° C.

* * * * *